United States Patent
Choi et al.

(10) Patent No.: US 8,198,970 B2
(45) Date of Patent: Jun. 12, 2012

(54) TRANSFORMERS, BALANCED-UNBALANCED TRANSFORMERS (BALUNS) AND INTEGRATED CIRCUITS INCLUDING THE SAME

(75) Inventors: Tae-Hoon Choi, Suwon-si (KR); Chul-Ho Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 98 days.

(21) Appl. No.: 12/453,465

(22) Filed: May 12, 2009

(65) Prior Publication Data

US 2009/0284339 A1    Nov. 19, 2009

(30) Foreign Application Priority Data

May 14, 2008  (KR) .......................... 10-2008-0044495

(51) Int. Cl.
*H01F 5/00* (2006.01)
*H01F 27/28* (2006.01)

(52) U.S. Cl. .......................... 336/200; 336/223; 336/232

(58) Field of Classification Search .......... 336/123–127, 336/172–173, 188–189, 200, 192, 223, 232
See application file for complete search history.

(56) References Cited

U.S. PATENT DOCUMENTS

| | | | | |
|---|---|---|---|---|
| 5,959,522 A | * | 9/1999 | Andrews | 336/200 |
| 6,801,114 B2 | * | 10/2004 | Yang et al. | 336/200 |
| 2004/0056749 A1 | * | 3/2004 | Kahlmann et al. | 336/200 |
| 2007/0247269 A1 | * | 10/2007 | Papananos | 336/200 |
| 2008/0284552 A1 | * | 11/2008 | Lim et al. | 336/200 |

FOREIGN PATENT DOCUMENTS

| | | |
|---|---|---|
| JP | 2005-191217 | 7/2005 |
| KR | 10-2004-0014973 | 2/2004 |

* cited by examiner

*Primary Examiner* — Elvin G Enad
*Assistant Examiner* — Ronald Hinson
(74) *Attorney, Agent, or Firm* — Harness, Dickey & Pierce, PLC

(57) ABSTRACT

A transformer of fully symmetric structure includes a primary coil assembly and a secondary coil assembly. The primary coil assembly includes a plurality of primary coils formed in a plurality of metal layers, and a first interlayer connection unit for connecting the primary coils. The secondary coil assembly includes a plurality of secondary coils formed in the plurality of metal layers, and a second interlayer connection unit for connecting the secondary coils. The primary and secondary coils formed in the same metal layer are concentric and axisymmetric with respect to a diameter line passing through a planar center point. A balanced-unbalanced transformer (balun) is a type of transformer that may be used to convert an unbalanced signal to a balanced one or vice versa. An integrated circuit may include a semiconductor substrate and a transformer. Electrical elements such as transistors may be formed on the semiconductor substrate.

20 Claims, 11 Drawing Sheets

TRANSFORMERS, BALANCED-UNBALANCED TRANSFORMERS (BALUNS) AND INTEGRATED CIRCUITS INCLUDING THE SAME

FOREIGN PRIORITY STATEMENT

This application claims priority under 35 U.S.C. §119 to Korean Patent Application No. 10-2008-0044495, filed on May 14, 2008, in the Korean Intellectual Property Office (KIPO), the contents of which are herein incorporated by reference in their entirety.

BACKGROUND

1. Field

Example embodiments relate to structure of transformers, for example, a symmetric transformer, a balanced-unbalanced transformer (balun) and an integrated circuit including the symmetric transformer.

2. Description of the Related Art

Requirement for low cost monolithic integrated circuits are accelerating techniques of integrating more elements in a single chip. A system-on-chip (SoC) includes a system that has a variety of electrical components formed on a printed circuit board (PCB) or a semiconductor substrate.

A passive element, for example, a transformer, integrated in the SoC may have a relatively poor performance than an off-chip transformer.

The transformer may include two inductors, for example, two coils that are disposed such that they may be coupled electromagnetically. The transformer may transfer a signal from an input coil to an output coil. A performance of a transformer is based on several factors, including, but not limited to, inductance of the coils, a quality factor (Q-factor), a magnetic coupling ratio, overall symmetry of the transformer structure. A high performance transformer has a higher inductance value, a higher Q-factor, a higher magnetic coupling ratio and high overall symmetry.

An on-chip transformer may be realized by two separate coils formed and suitably disposed on a semiconductor substrate. Passive elements such as inductors and transformers may be formed in upper layers on the semiconductor substrate after forming wires. The on-chip transformer may be required to occupy a smaller area to achieve an increased degree of integration, but characteristics of such an on-chip transformer, for example, a Q-factor and a magnetic coupling ratio maybe affected (for example, reduced) as a size of the transformer is reduced. The on-chip transformer may also have a relatively low performance as compared to the off-chip transformer, because a thickness of a metal layer forming the on-chip transformer and losses in the semiconductor substrate may be relatively higher. Under such integration conditions, optimization of the on-chip transformer structure may be required for an increased performance of the on-chip transformer.

The conventional on-chip transformer occupies a larger area, however provides a smaller value of inductance. A primary coil and a secondary coil may be disposed vertically with respect to each other to decrease horizontal occupation area. In this case, however, symmetry of the transformer may be reduced due to asymmetric parasitic capacitances between an upper coil and a lower coil. If a higher number of metal layers are used to obtain desired characteristics, a distance between the transformer and the semiconductor substrate may be decreased and thus the losses into the semiconductor substrate may be increased.

SUMMARY

According to example embodiments, a transformer may include a primary coil assembly and a secondary coil assembly. The primary coil assembly may include a plurality of primary coils formed in a plurality of metal layers, and a first interlayer connection unit for connecting the primary coils. Each primary coil may have at least one turn. The secondary coil assembly may include a plurality of secondary coils formed in the plurality of metal layers, and a second interlayer connection unit for connecting the secondary coils. Each secondary coil may have at least one turn. The primary and secondary coils formed in the same metal layer are concentric and axisymmetric with respect to a diameter line passing through a planar center point.

The primary coil assembly and the secondary coil assembly may be axisymmetric with respect to a vertical axis that is perpendicular to the metal layers and that passes through the planar center point.

Each of the primary and secondary coils may include a plurality of segments and each of the primary and secondary coils may have an average radius that may decrease per half turn.

In the transformer, according to example embodiments and with respect to each primary coil and each secondary coil formed in the same metal layer, each primary coil may include a first segment corresponding to a half turn with a first average radius and a second segment corresponding to another half turn with a second average radius that is shorter than the first average radius. Each secondary coil may include a third segment corresponding to a half turn with the second average radius and a fourth segment corresponding to another half turn with the first average radius such that the third segment is formed inside the first segment and the fourth segment is formed outside the second segment.

According to some example embodiments, the primary coils may include a first primary coil formed in a first metal layer and a second primary coil formed in a second metal layer under the first metal layer, and the secondary coils may include a first secondary coil formed in the first metal layer and a second primary coil formed in the second metal layer, such that the first primary coil may overlie the second primary coil and the first secondary coil may overlie the second secondary coil.

According to example embodiments, the primary coil assembly may further include a primary crossing unit for crossing the second secondary coil, and the secondary coil assembly may further include a secondary crossing unit for crossing the second primary coil.

The primary crossing unit may include a first bridge formed in a third metal layer and third and fourth interlayer connection units for connecting both ends of the first bridge to the second primary coil formed in the second metal layer. The third metal layer may lie below the second metal layer. The secondary crossing unit may include a second bridge formed in the third metal layer and fifth and sixth interlayer connection units for connecting both ends of the second bridge to the second secondary coil formed in the second metal layer.

According to example embodiments, the primary crossing unit may be formed under the second interlayer connection unit of the secondary coil assembly, and the secondary crossing unit may be formed under the first interlayer connection unit of the primary coil assembly.

According to other example embodiments, the primary crossing unit may be formed under the first interlayer connection unit of the primary coil assembly, and the secondary crossing unit may be formed under the second interlayer connection unit of the secondary coil assembly.

According to example embodiments, the primary coil assembly may further include a first primary terminal formed in the first metal layer and a second primary terminal formed in a third metal layer, such that the first primary terminal is connected to an outer end of the first primary coil and the second primary terminal is connected to an inner end of the second primary coil. The third metal layer may lie below the second metal layer. Similarly, the secondary coil assembly may further include a first secondary terminal formed in the first metal layer and a second secondary terminal formed in the third metal layer, such that the first secondary terminal is connected to an outer end of the first secondary coil and the second secondary terminal is connected to an inner end of the second secondary coil.

A current path through the primary coil assembly, from the first primary terminal to the second primary terminal, may be centripetal in both of the first and second primary coils, and a current path through the secondary coil assembly, from the second secondary terminal to the first secondary terminal, may be centrifugal in both of the first and second secondary coils.

According to example embodiments, the plurality of primary coils may include a first primary coil formed in a first metal layer and a second primary coil formed in a second metal layer, and the plurality of secondary coils may include a first secondary coil formed in the first metal layer and a second primary coil formed in the second metal layer. The second metal layer may lie below the first metal layer. The first primary coil may overlie the second secondary coil and the first secondary coil may overlie the second primary coil.

The primary coil assembly may further include a first primary terminal formed in the first metal layer and a second primary terminal formed in the second metal layer, such that the first primary terminal is connected to an outer end of the first primary coil and the second primary terminal is connected to an outer end of the second primary coil. Similarly, the secondary coil assembly may further include a first secondary terminal formed in the first metal layer and a second secondary terminal formed in the second metal layer, such that the first secondary terminal is connected to an outer end of the first secondary coil and the second secondary terminal is connected to an outer end of the second secondary coil.

According the example embodiments, a current path through the primary coil assembly from the first primary terminal to the second primary terminal may be centripetal in the first primary coil and centrifugal in the second primary coil, and a current path through the secondary coil assembly from the second secondary terminal to the first secondary terminal may be centripetal in the second secondary coil and centrifugal in the first secondary coil.

The transformer, as per example embodiments, may be somewhat octagonal in shape when viewed from the top, and the primary and secondary coils formed in the same metal layer may be axisymmetric with respect to the diameter line that passes through center points of two opposite sides of the regular octagon.

In accordance with some example embodiments, a balanced-unbalanced transformer (balun) may include a transformer according to the example embodiments and a center tap that maybe connected to the primary or the secondary coil assembly at a point midway along the length of the primary coil assembly or the secondary coil assembly.

According to example embodiments, an integrated circuit may include a semiconductor substrate having a plurality of electrical elements and a transformer, according to the example embodiments, formed over the semiconductor substrate. At least one terminal of the transformer may be coupled to at least one of the electrical elements in the semiconductor substrate The primary coil assembly and the secondary coil assembly may be axisymmetric with respect to a vertical axis that is perpendicular to the plurality of metal layers and that passes through the planar center point.

According to other example embodiments, the integrated circuit may further include a shield pattern layer between the transformer and the semiconductor substrate. A plurality of patterns may be formed on the shield pattern layer.

According to example embodiments, the integrated circuit may further include a center tap connected to the primary or the secondary coil assembly at a point midway along the length of the primary coil assembly or the secondary coil assembly. The primary coil assembly or the secondary coil assembly may be connected to an antenna for receiving and/or transmitting a radio frequency signal.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
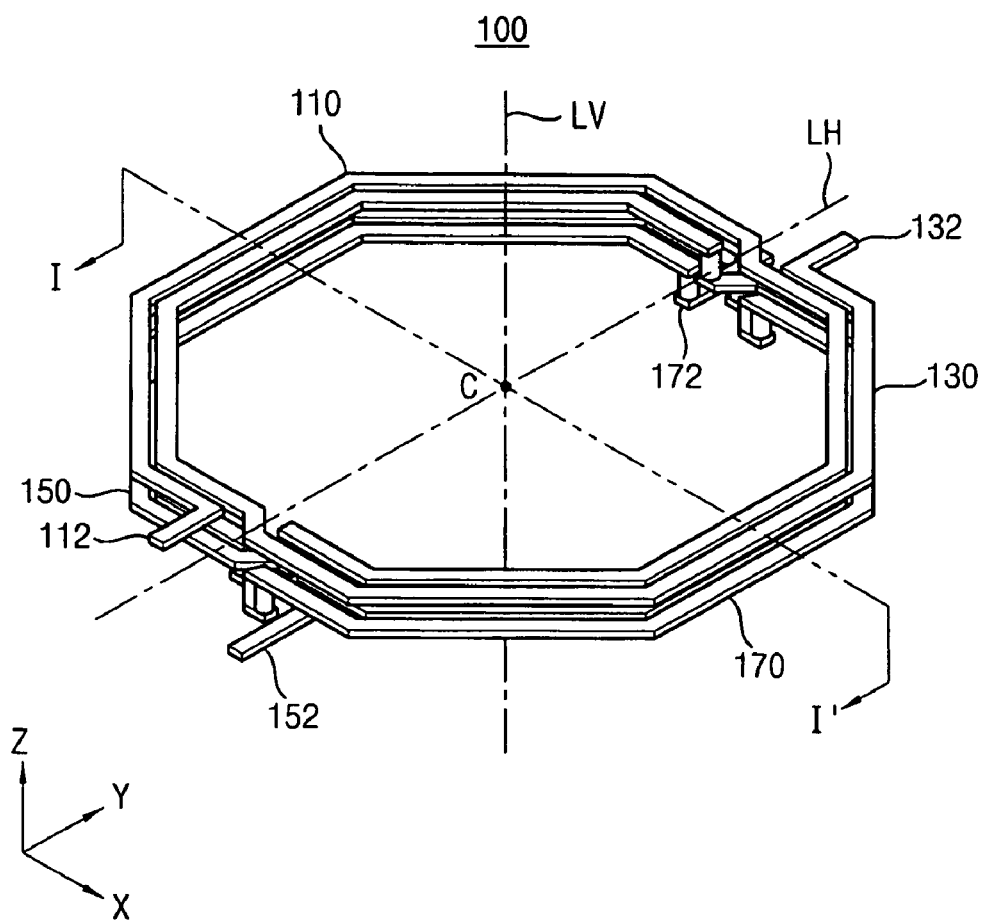
FIG. 1 illustrates a three-dimensional view of a transformer according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
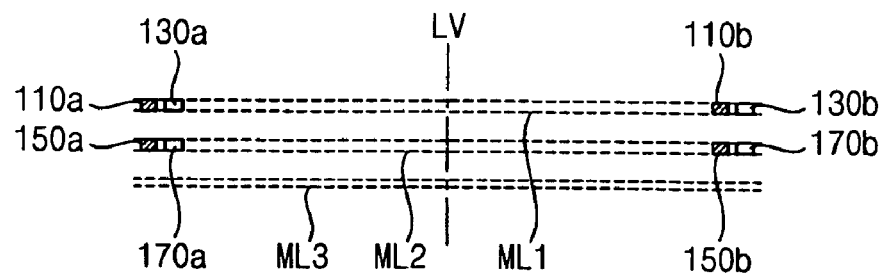
FIG. 2 is a cross-sectional view of the transformer of FIG. 1 taken along line I-I'.
Figure 3:
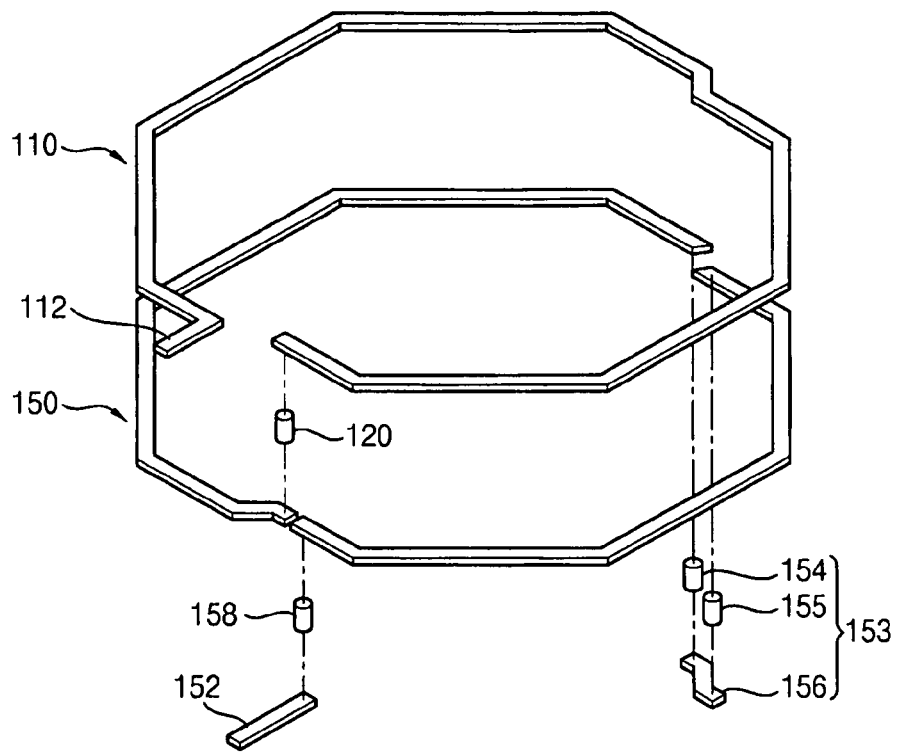
FIGS. 3 and 4 illustrate a primary coil assembly and a secondary coil assembly included in the transformer 100 of FIG. 1.
Figure 4:
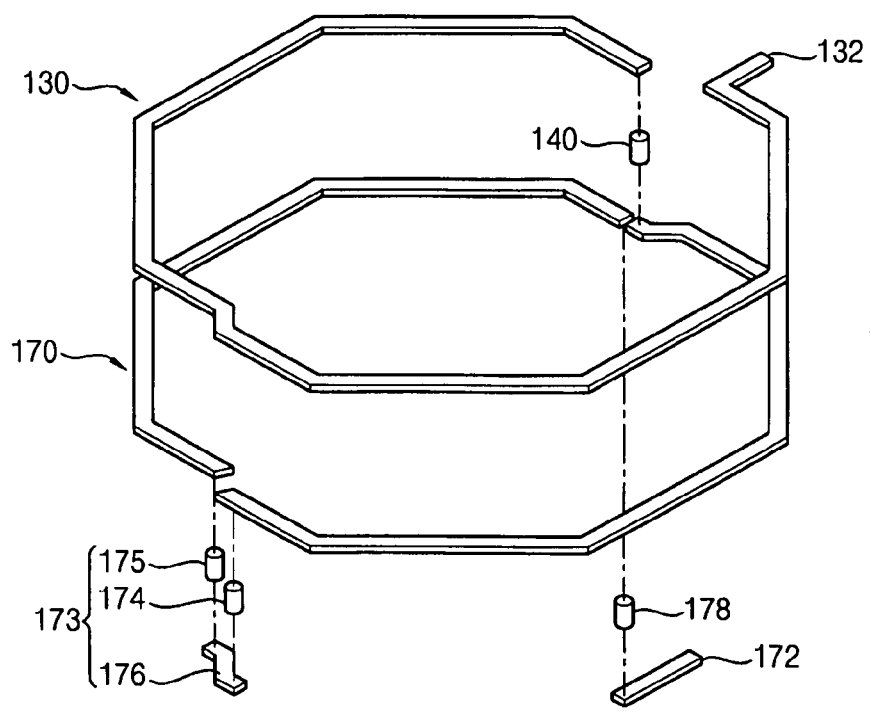
Figure 5:
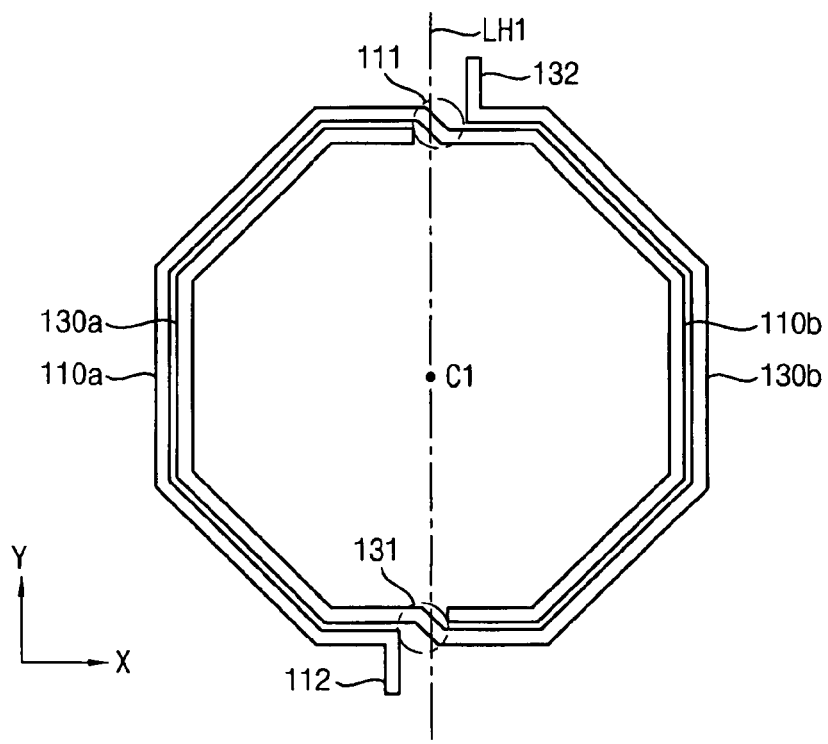
FIGS. 5 and 6 are top views of the primary and secondary coil assemblies as formed in the respective first and second metal layers of the transformer 100 of FIG. 1.
Figure 6:
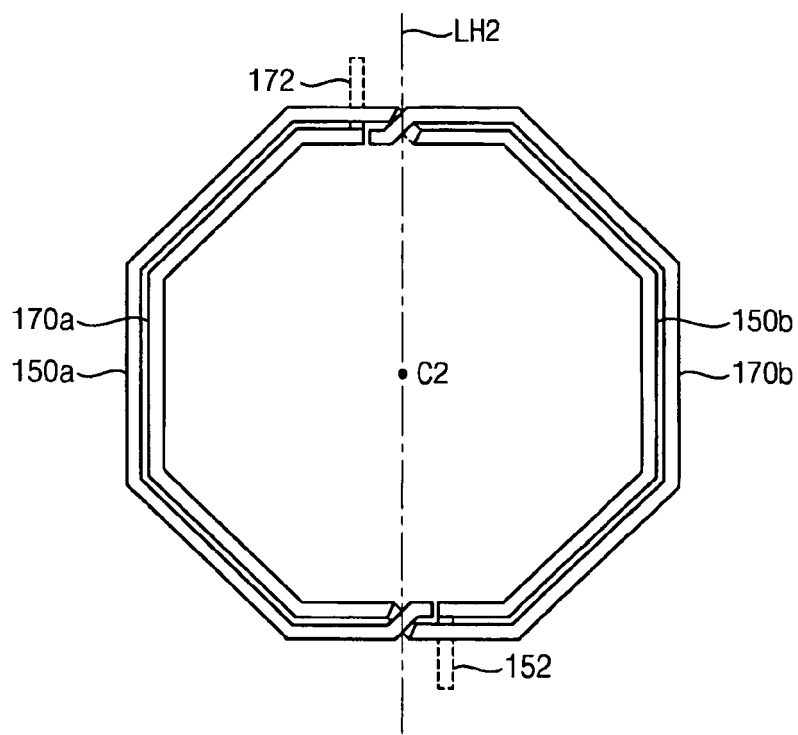

FIG. 1 is a three-dimensional view of a transformer according to example embodiments. FIG. 2 is a cross-sectional view of the transformer of FIG. 1 taken as along the line I-I'. FIGS. 3 and 4 are three-dimensional views of a primary coil assembly and a secondary coil assembly of transformer 100 of FIG. 1. FIGS. 5 and 6 are top views of the primary and secondary coil assemblies as formed in the respective first and second metal layers of the transformer 100 of FIG. 1.

Referring to FIGS. 1 through 6, a transformer 100 includes a primary coil assembly and a secondary coil assembly. The primary coil assembly includes a plurality of primary coils 110 and 150 respectively formed in a plurality of metal layers ML1 and ML2, and a first interlayer connection unit 120 connecting the primary coils 110 and 150. The secondary coil assembly includes a plurality of secondary coils 130 and 170 respectively formed in the plurality of metal layers ML1 and ML2, and a second interlayer connection unit 140 connecting the secondary coils 130 and 170. Each of the primary coils 110 and 150 and the secondary coils 130 and 170 may have at least one turn. As illustrated in the example embodiment of FIG. 1, each of the coils 110, 130, 150 and 170 has one turn. As such, the primary and secondary coil assemblies each have a turn formed in the two metal layers ML1 and ML2.

The primary and secondary coils formed in the same metal layer are concentric and axisymmetric with respect to a diameter line passing through a planar center point. For example, referring to FIGS. 5 and 6, the first primary coil 110 and the first secondary coil 130 formed in the first metal layer ML1 are axisymmetric with respect to a diameter line LH1 passing through a planar center point C1, and the second primary coil 150 and the second secondary coil 170 formed in the second metal layer ML2 are axisymmetric with respect to a diameter line LH2 passing through a planar center point C2.

Accordingly, in the transformer 100 of FIG. 1, the primary coil assembly and the secondary coil assembly are axisymmetric with respect to a vertical axis LV that is perpendicular to the metal layers ML1 and ML2 and passes through the planar center points C1 and C2. Also shown is horizontal axis LH. Put differently, the primary coil assembly and the secondary coil assembly are point-symmetric with respect to a three-dimensional center point C, and thus the transformer 100 is fully symmetric.

Each of the primary coils 110 and 130 and secondary coils 150 and 170 include a plurality of segments having average radii that decreases per half turn. The segments of the primary coils 110 and 130 and secondary coils 150 and 170 formed in the same metal layer are axisymmetric with respect to the diameter line. For example, as illustrated in FIG. 5, the first primary coil 110 formed in the first metal layer ML1 includes a first segment 110a corresponding to a half turn with a first average radius and a second segment 110b corresponding to another half turn with a second average radius, shorter than the first average radius. Similarly, the first secondary coil 130 formed in the first metal layer ML1 includes a third segment 130a corresponding to a half turn with the second average radius and a fourth segment 130b corresponding to another half turn with the first average radius. The third segment 130a is formed inside the first segment 110*a* and the fourth segment 130*b* is formed outside the second segment 110*b*.

Also, as illustrated in FIG. 6, the second primary coil 150 formed in the second metal layer ML2 includes a first segment 150*a* corresponding to a half turn with the first average radius and a second segment 150*b* corresponding to another half turn with the second average radius, shorter than the first average radius. Similarly, the second secondary coil 170 formed in the second metal layer ML2 includes a third segment 170*a* corresponding to a half turn with the second average radius and a fourth segment 170*b* corresponding to another half turn with the first average radius such that the third segment 170*a* is formed inside the first segment 150*a* and the fourth segment 170*b* is formed outside the second segment 150*b*.

Figure 8:
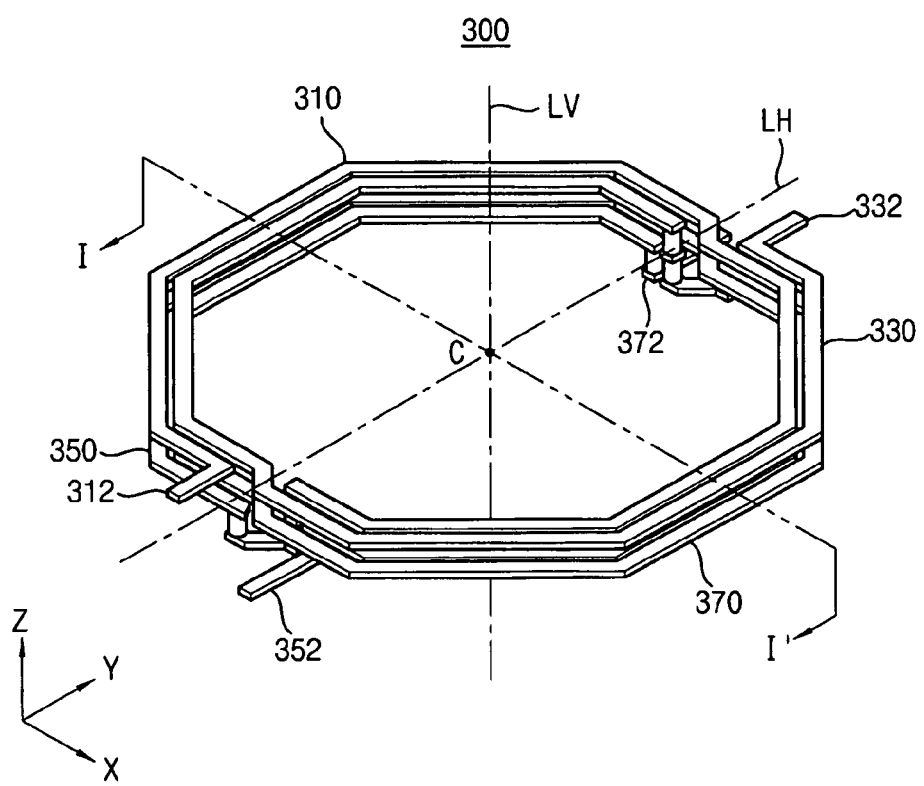
FIG. 8 illustrates a three-dimensional view of a transformer according to other example embodiments.
Figure 13:
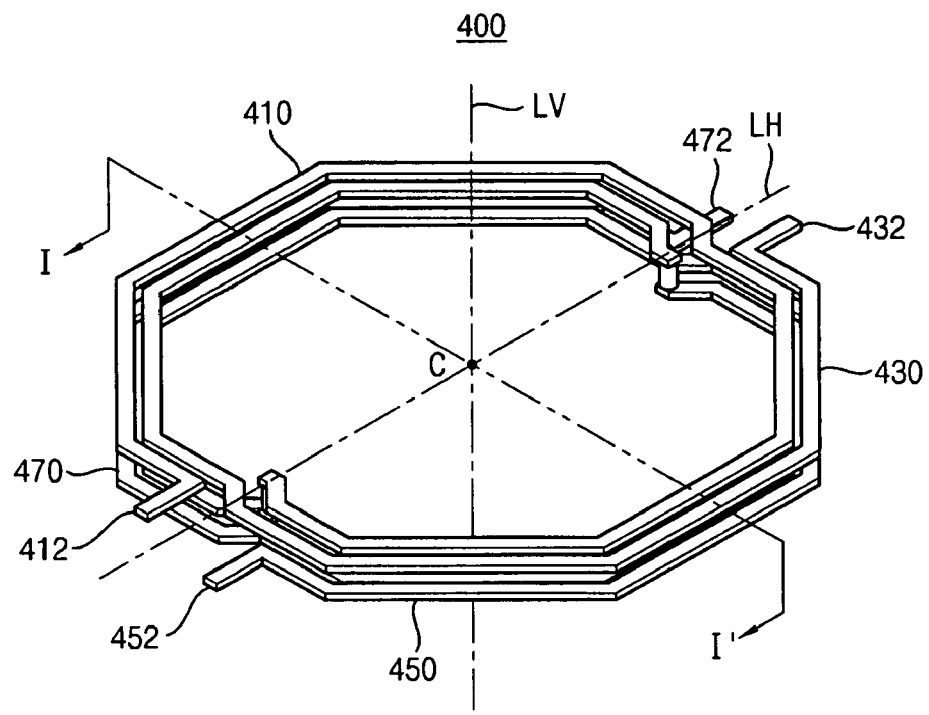
FIG. 13 illustrates a three-dimensional view of a transformer according to another example embodiment.
Figure 17:
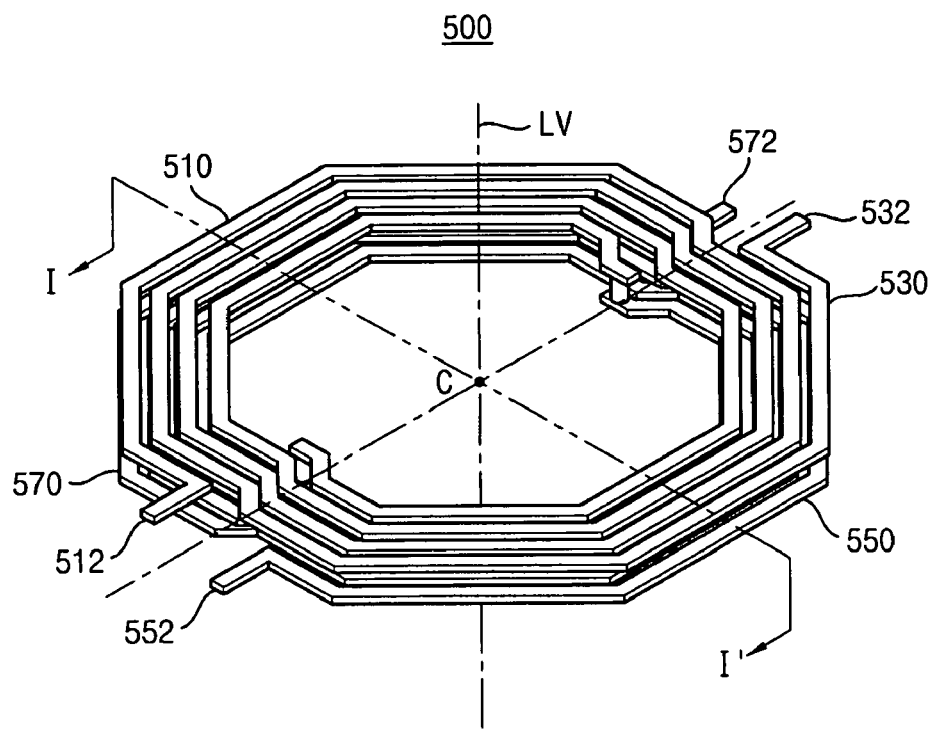
FIG. 17 illustrates a three-dimensional view of a transformer according to example embodiments.

The discussion above with respect to transformer 100 of FIG. 1 also applies to the example transformers illustrated in FIGS. 8, 13, and 17, and is therefore omitted for the sake of brevity.

As described above, the transformers according to example embodiments have a stacked spiral structure, wherein primary and secondary coils in the same metal layer are interwound, and wherein a plurality of coils are formed in a plurality of metal layers. As a result of such structure, both planar and vertical coupling may be induced and thus the transformer may have a relatively high inductance and magnetic coupling ratio. Also, because of the fully symmetric structure, interferences due to elements near the transformer are also symmetric, thereby increasing the performance characteristics of the transformer.

Referring again to FIGS. 1 through 6, the primary coils include the first primary coil 110 formed in the first metal layer ML1 and the second primary coil 150 formed in the second metal layer ML2. The secondary coils include the first secondary coil 130 formed in the first metal layer ML1 and the second secondary coil 170 formed in the second metal layer ML2. The numbers of the primary coils and the secondary coils may depend on the number of the metal layers in the transformer and each coil may have two or more turns.

As illustrated in the transformer 100 of FIG. 1, the first primary coil 110*a* and 110*b* may overlie the second primary coil 150*a* and 150*b* and the first secondary coil 130*a* and 130*b* may overlie the second secondary coil 170*a* and 170*b*. In this case, the primary coil assembly may further include a primary crossing unit 153 as illustrated in FIG. 3 for crossing the second secondary coil 130, and the secondary coil assembly may further include a secondary crossing unit 173 as illustrated in FIG. 4 for crossing the second primary coil 150.

The primary crossing unit 153 may be formed under the second interlayer connection unit 140 of the secondary coil assembly, and the secondary crossing unit 173 may be formed under the first interlayer connection unit 120 of the primary coil assembly.

The primary crossing unit 153 may include a first bridge 156 formed in a third metal layer ML3 lying below the second metal layer ML2, and third and fourth interlayer connection units 154 and 155 for connecting both ends of the first bridge 156 to the second primary coil 150 formed in the second metal layer ML2. The secondary crossing unit 173 may include a second bridge 176 formed in the third metal layer ML3 lying below the second metal layer ML2, and fifth and sixth interlayer connection units 174 and 175 for connecting both ends of the second bridge 176 to the second secondary coil 170 formed in the second metal layer ML2. The primary crossing unit 153 and the secondary crossing unit 173 are also axisymmetric with respect to the vertical axis LV, thereby maintaining the fully symmetric structure of the transformer 100.

As illustrated in FIGS. 1 through 6, the primary coil assembly may further include a first primary terminal 112 formed in the first metal layer ML1 (not shown) and a second primary terminal 152 formed in the third metal layer ML3 (not shown), such that the first primary terminal 112 is connected to an outer end of the first primary coil 110 and the second primary terminal 152 is connected to an inner end of the second primary coil 150 using seventh interlayer connection unit 158. Similarly, the secondary coil assembly may further include a first secondary terminal 132 formed in the first metal layer ML1 (not shown) and a second secondary terminal 172 formed in the third metal layer ML3 (not shown), such that the first secondary terminal 132 is connected to an outer end of the first secondary coil 130 and the second secondary terminal 172 is connected to an inner end of the second secondary coil 170 using eighth interlayer connection unit 178. The first and second primary terminals 112 and 152 and the first and second secondary terminals 132 and 172 are also axisymmetric with respect to the vertical axis LV so that the fully symmetric structure of the transformer 100 is maintained.

A current path through the primary coil assembly, from the first primary terminal 112 to the second primary terminal 152, is centripetal in both the first and second primary coils 110 and 150, and a current path through the secondary coil assembly, from the second secondary terminal 172 to the first secondary terminal 132, is centrifugal in both of the first and second secondary coils 130 and 170. In other words, with respect to the primary coil assembly, the first primary coil 110, formed in the first metal layer ML1, is centripetal from the outer end connected to the first primary terminal 112, an inner end connected to the second metal layer ML2 through the first interlayer connection unit 120, the second primary coil 150, formed in the second metal layer ML2, is centripetal from the outer end to the inner end connected to the second primary terminal 152. Similar may be said with respect to the secondary coil assembly. As such, the secondary coil assembly is fully symmetric with the primary coil assembly.

The transformer 100 has a spiral structure in which the primary coil and the secondary coil in the same metal layer are interwound with each other. Respective portions of each primary and secondary coil may be considered to be of a shape of a bar having a length larger than its width or a thickness. The primary and secondary coils are formed of conductive materials such as metals, and the interlayer connection units may be formed using via-holes or via-contacts, for example.

In the example embodiments of FIGS. 1 through 6, each primary coil and each secondary coil are formed in a single metal layer. However, in other example embodiments, each primary coil and each secondary coil may be formed using a plurality of adjacent metal layers by connecting the adjacent metal layers with conductive plugs.

The shape of the transformer 100 may be considered as somewhat circular or polygonal when viewed from top. For example, the transformer 100 may be considered to be somewhat octagonal in shape, as illustrated in FIGS. 5 and 6. Such an octagonal shape may have improved characteristics as compared to a tetragonal shape. The primary and secondary coils formed in the same metal layer are axisymmetric with respect to the diameter line LH1 and LH2 passing through the center of such an octagonal structure. For example, the segments 110*a* and 110*b* of the first primary coil 110 having different average radii may be connected through a radius conversion unit 111, and the segments 130*a* and 130*b* of the first secondary coil 130 having different average radii may be connected through a radius conversion unit 131. The segments 110*a*, 110*b*, 130*a*, 130*b*, 150*a*, 150*b*, 170*a* and 170*b*, the radius conversion units 111 and 131, the interlayer connection units 120 and 140 and the crossing units 153 and 173 are formed such that the primary and secondary coil assemblies may be fully symmetric with each other.

Figure 7:
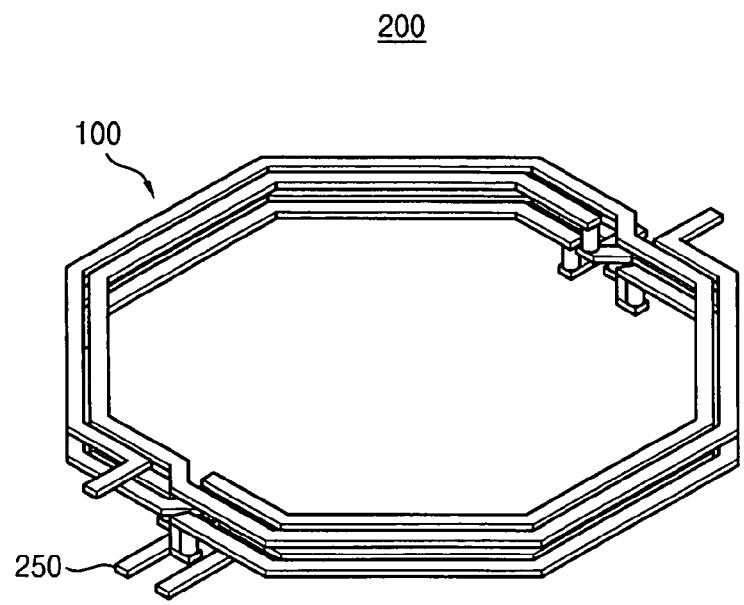
FIG. 7 illustrates a three-dimensional view of a balanced-unbalanced transformer (balun) according to example embodiments.

FIG. 7 is a three-dimensional view of a balanced-unbalanced transformer (balun) according to example embodiments.

A balun may be a device that couples a balanced line (one that has two conductors, with equal currents in opposite directions, for example, a twisted pair cable) to an unbalanced line (one that has just one conductor and a ground, for example, a coaxial cable). A balun is a type of transformer that may be used to convert an unbalanced signal to a balanced one or vice versa. A variety of types of baluns are well-known in the art, for example, autotransformer type, classical transformer type, transmission-line transformer type, delay line type or the like, each type having well-known applications.

Referring to FIG. 7, a balun 200, according to example embodiments, may include the transformer 100 of FIG. 1 and a center tap 250. As described with reference to FIGS. 1 through 6, the transformer 100 includes the primary coil assembly and the secondary coil assembly having a fully symmetric structure. The center tap 250 may be connected to the primary and/or secondary assemblies at a point that is midway along the length of the primary coil and/or the secondary coil. For example, the center tap 250 may be connected near the outer end of the second primary coil 150 and may be formed in the second metal layer ML2.

Figure 9:
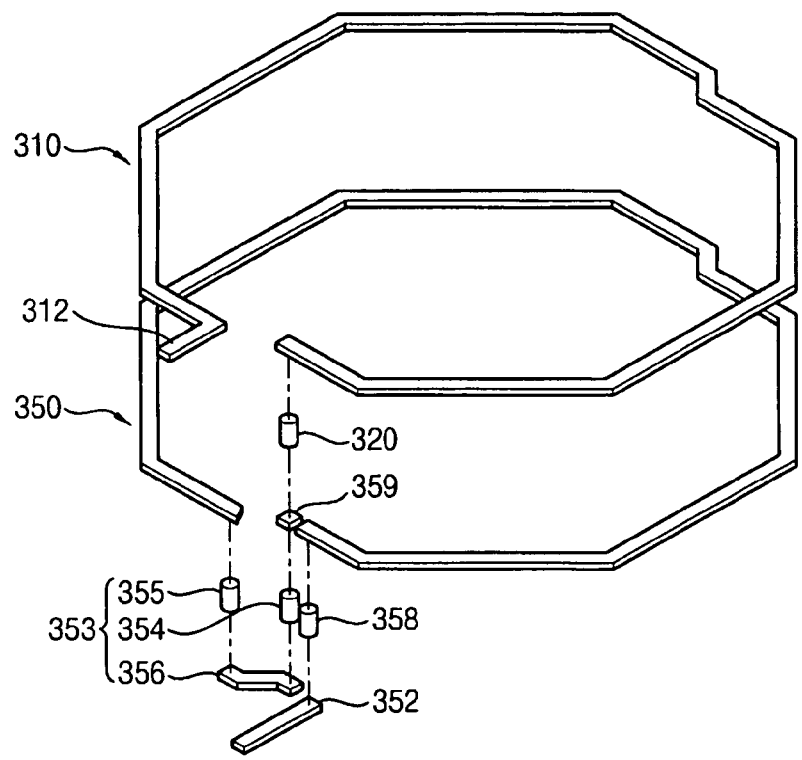
FIGS. 9 and 10 illustrate three-dimensional views of a primary coil assembly and a secondary coil assembly included in the transformer 300 of FIG. 8.
Figure 10:
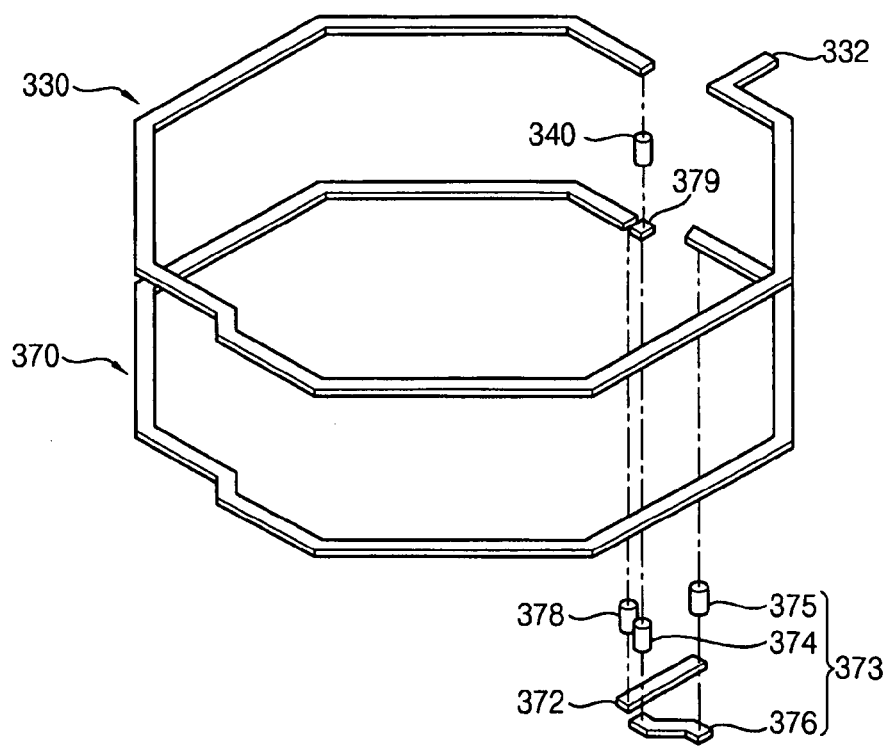
Figure 11:
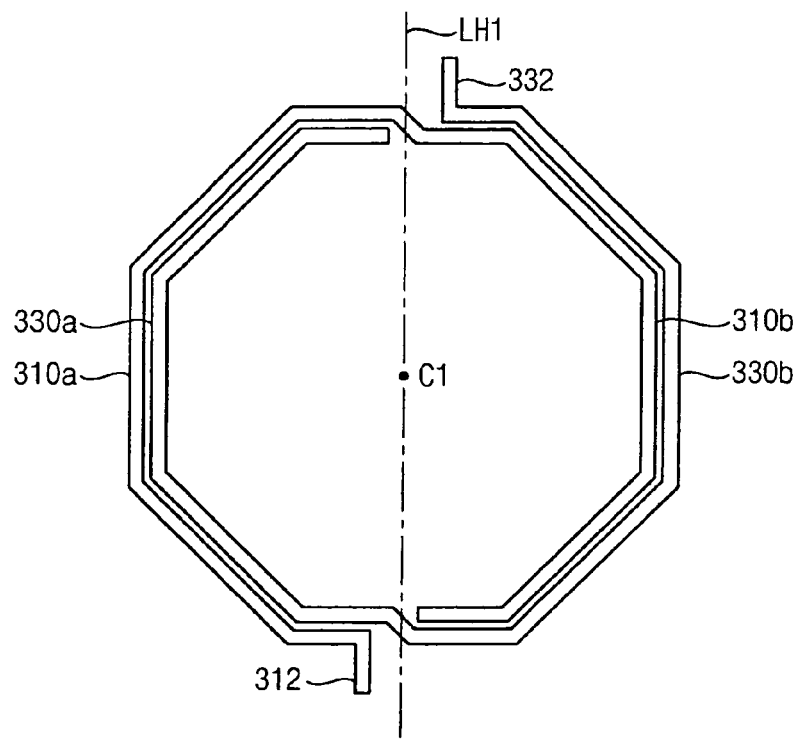
FIGS. 11 and 12 are top views of the primary and secondary coil assemblies as formed in the respective first and second metal layers of the transformer of FIG. 8.
Figure 12:
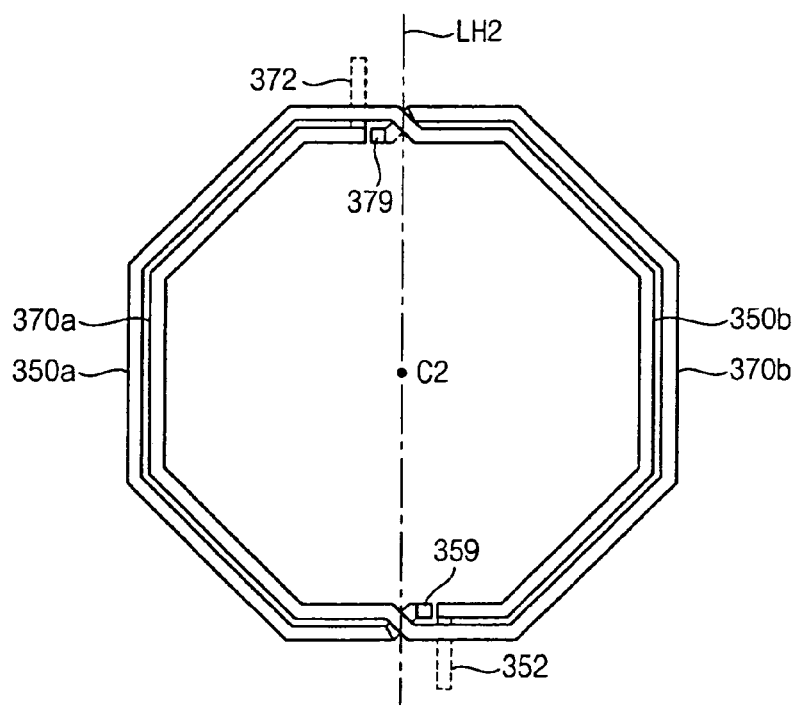

FIG. 8 is a three-dimensional view of a transformer according to other example embodiments. FIGS. 9 and 10 are three-dimensional views of a primary coil assembly and a secondary coil assembly included in the transformer of FIG. 8. FIGS. 11 and 12 are top views of the primary coil assembly and the secondary coil assembly of the transformer of FIG. 8 as formed in the first and second metal layers. A cross-sectional view of the transformer 300 of FIG. 8 taken as along the line I-I' may be somewhat similar to the cross-sectional view illustrated in FIG. 2.

Referring to FIGS. 8 through 12, the transformer 300 includes a primary and secondary coil assembly somewhat similar to the transformer 100 of FIG. 1. The primary coil assembly includes a plurality of primary coils 310 and 350 respectively formed in a plurality of metal layers ML1 and ML2, and a first interlayer connection unit 320 for connecting the primary coils 310 and 350. The secondary coil assembly includes a plurality of secondary coils 330 and 370 respectively formed in the plurality of metal layers ML1 and ML2, and a second interlayer connection unit 340 for connecting the secondary coils 330 and 370. Each of the primary coils 310 and 350 and the secondary coils 330 and 370 may have at least one turn. Also shown are first primary terminal 312, second primary terminal 352, first secondary terminal 332, and second secondary terminal 372.

The primary and secondary coils formed in the same metal layer are concentric and axisymmetric with respect to a diameter line passing through a planar center point. For example, referring to FIGS. 11 and 12, the first primary coil 310 and the first secondary coil 330, formed in the first metal layer ML1, are axisymmetric with respect to a diameter line LH1 passing through a planar center point C1, and the second primary coil 350 and the second secondary coil 370, formed in the second metal layer ML2, are axisymmetric with respect to a diameter line LH2 passing through a planar center point C2. Also shown are first segment 310a, second segment 310b, third segment 330a, fourth segment 330b, fifth segment 350a, sixth segment 350b, seventh segment 370a, and eighth segment 370b.

As compared to the transformer 100 of FIG. 1, wherein the primary crossing unit 153 is formed below the second interlayer connection unit 140 of the secondary coil assembly and, wherein the secondary crossing unit 173 is formed below the first interlayer connection unit 120 of the primary coil assembly, the primary crossing unit 353 of the transformer 300 is formed under the first interlayer connection unit 320 of the primary coil assembly and the secondary crossing unit 373 of the transformer 300 is formed under the second interlayer connection unit 340 of the secondary coil assembly.

The primary crossing unit 353 may include a first bridge 356 formed in a third metal layer ML3 lying below the second metal layer ML2, and third and fourth interlayer connection units 354 and 355 for connecting both ends of the first bridge 356 to the second primary coil 350 formed in the second metal layer ML2. The secondary crossing unit 373 may include a second bridge 376 formed in the third metal layer ML3 lying below the second metal layer ML2, and fifth and sixth interlayer connection units 374 and 375 for connecting both ends of the second bridge 376 to the second secondary coil 370 formed in the second metal layer ML2. The third interlayer connection unit 354 may be formed directly under the first interlayer connection unit 320 by means of a fractional segment 359 of the second primary coil 350, as illustrated in FIG. 9. Similarly, the fifth interlayer connection unit 374 may be formed directly under the second interlayer connection unit 340 by means of a fractional segment 379 of the second secondary coil 370. The primary crossing unit 353 and the secondary crossing unit 373 are also axisymmetric with respect to the vertical axis LV so that the fully symmetric structure of the transformer 300 may be maintained. Also shown are center point C, horizontal axis LH, seventh interlayer connection unit 358, and eighth interlayer connection unit 378.

Figure 14:
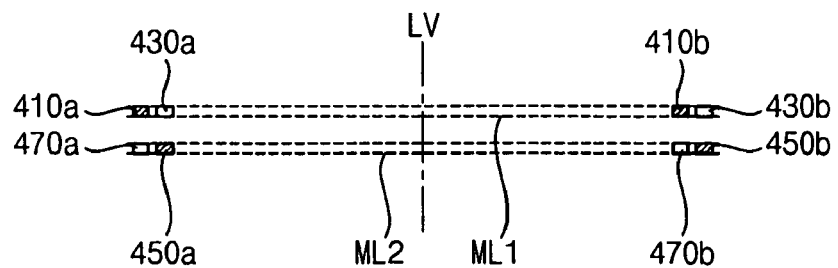
FIG. 14 is a cross-sectional view of the transformer of FIG. 13 taken as along the line I-I'.
Figure 15:
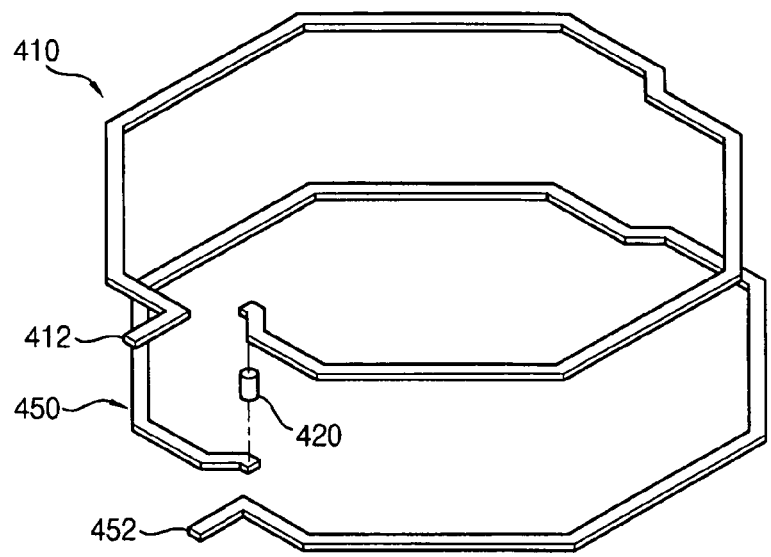
FIGS. 15 and 16 illustrate three-dimensional views of a primary coil assembly and a secondary coil assembly included in the transformer 400 of FIG. 13.
Figure 16:
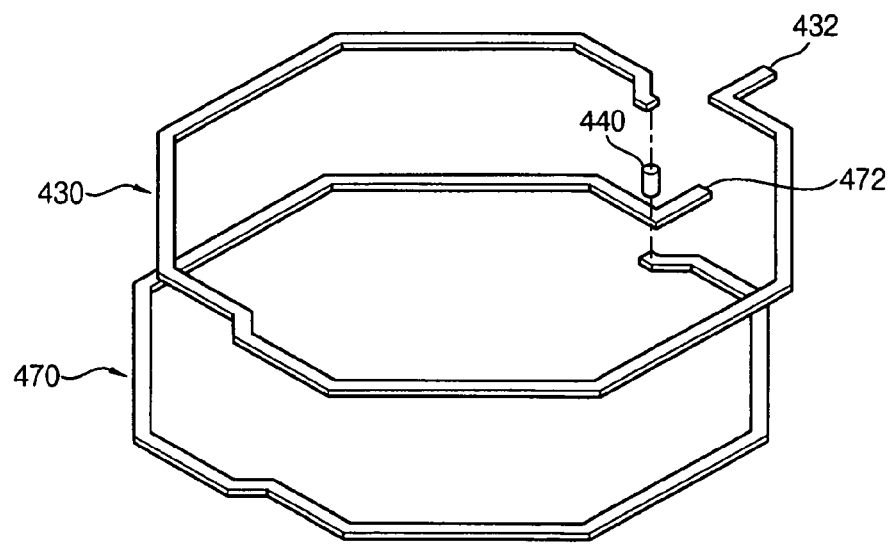

FIG. 13 is a three-dimensional view of a transformer according to example embodiments. FIG. 14 is a cross-sectional view of the transformer of FIG. 13 taken along the line I-I'. FIGS. 15 and 16 are three-dimensional views of a primary coil assembly and a secondary coil assembly included in the transformer 400 of FIG. 13.

Referring to FIGS. 13 through 16, the transformer 400 includes a primary and secondary coil assembly somewhat similar to the transformer 100 of FIG. 1. The primary coil assembly includes a plurality of primary coils 410 and 450 respectively formed in a plurality of metal layers ML1 and ML2, and a first interlayer connection unit 420 for connecting the primary coils 410 and 450. The secondary coil assembly includes a plurality of secondary coils 430 and 470 respectively formed in the plurality of metal layers ML1 and ML2, and a second interlayer connection unit 440 for connecting the secondary coils 430 and 470. Each of the primary coils 410 and 450 and the secondary coils 430 and 470 may have at least one turn.

The primary and secondary coils formed in the same metal layer are concentric and axisymmetric with respect to a diameter line passing through a planar center point. For example, the first primary coil 410 and the first secondary coil 430 formed in the first metal layer ML1 are axisymmetric with respect to a diameter line LH1 passing through a planar center point C1 (referring to LH1 and C1 in FIG. 11, for example), and the second primary coil 450 and the second secondary coil 470 formed in the second metal layer ML2 are axisymmetric with respect to a diameter line LH2 passing through a planar center point C2 (referring to LH2 and C2 in FIG. 12, for example). Also shown are center point C and horizontal axis LH.

As compared to the transformer 100 of FIG. 1, wherein the first primary coil 110 (including first and second segments 110a and 110b) overlies the second primary coil 150 (including fifth and sixth segments 150a and 150b) and the first secondary coil 130 (including third and fourth segments 130a and 130b) overlies the second secondary coil 170 (including seventh and eighth segments 170a and 170b), the first primary coil 410 (including first and second segments 410a and 410b) in the transformer 400 of FIG. 13 overlies the second secondary coil 470 (including seventh and eighth segments 470a and 470b) and the first secondary coil 430 (including third and fourth segments 430a and 430b) overlies the second primary coil 450 (including fifth and sixth segments 450a and 450b).

As illustrated in FIGS. 13, 15 and 16, the primary coil assembly may further include a first primary terminal 412 formed in the first metal layer ML1 and a second primary terminal 452 formed in the second metal layer ML2, such that the first primary terminal 412 is connected to an outer end of the first primary coil 410 and the second primary terminal 452 is connected to an outer end of the second primary coil 450. Similarly, the secondary coil assembly may further include a first secondary terminal 432 formed in the first metal layer ML1 and a second secondary terminal 472 formed in the second metal layer ML2, such that the first secondary terminal 432 is connected to an outer end of the first secondary coil 430 and the second secondary terminal 472 is connected to an outer end of the second secondary coil 470. The first and second primary terminals 412 and 452 and the first and second secondary terminals 432 and 472 are also axisymmetric with respect to the vertical axis LV so that the fully symmetric structure of the transformer 400 is maintained.

A current path through the primary coil assembly, from the first primary terminal 412 to the second primary terminal 452, is centripetal in the first primary coil 410 and centrifugal in the second primary coil 450, and a current path through the secondary coil assembly from the second secondary terminal 472 to the first secondary terminal 432 is centripetal in the second secondary coil 470 and centrifugal in the first secondary coil 430. In other words, with respect to the primary coil assembly, the first primary coil 410, formed in the first metal layer ML1, is centripetal from the outer end connected to the first primary terminal 412, an inner end connected to the second metal layer ML2 through the first interlayer connection unit 420, and the second primary coil 450, formed in the second metal layer ML2, is centrifugal from an inner end to the outer end that is connected to the second primary terminal 452. Similar may be said with respect to the secondary coil assembly. As such, the secondary coil assembly is fully symmetric with the primary coil assembly.

Figure 18:
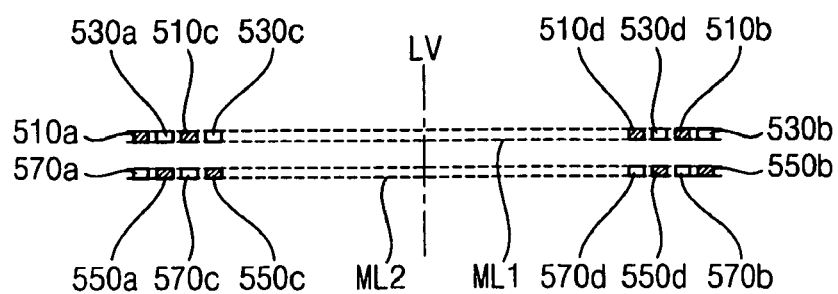
FIG. 18 is a cross-sectional view of the transformer of FIG. 17 taken as along the line I-I'.
Figure 19:
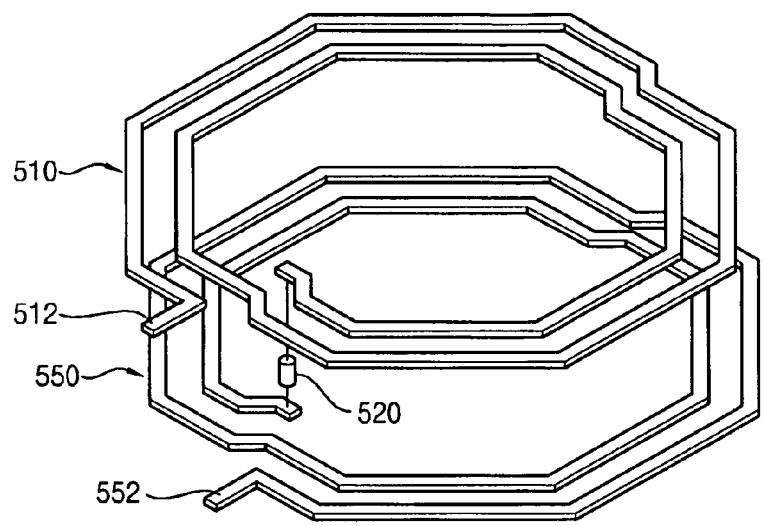
FIGS. 19 and 20 illustrate three-dimensional views of a primary coil assembly and a secondary coil assembly included in the transformer 500 of FIG. 17.
Figure 20:
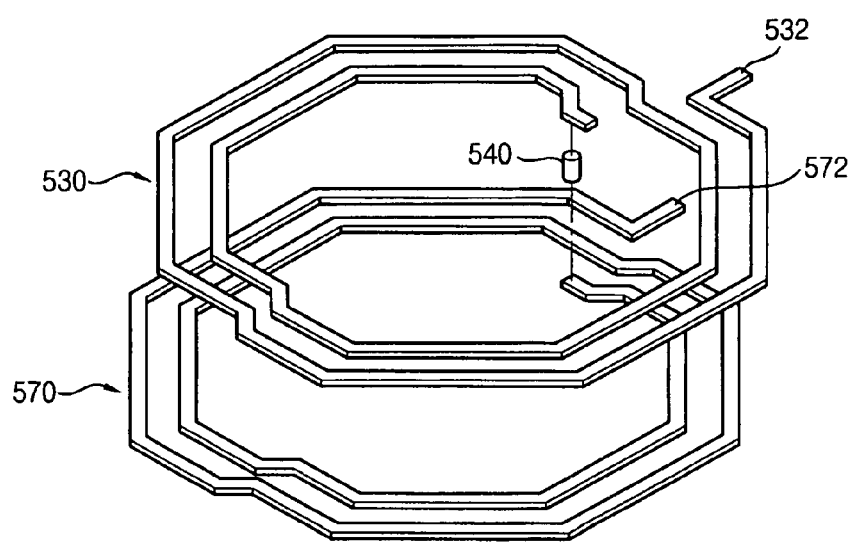

FIG. 17 is a three-dimensional view of a transformer 500 according to example embodiments. FIG. 18 is a cross-sectional view of the transformer 500 taken along the line I-I' in FIG. 17. FIGS. 19 and 20 are three-dimensional views of a primary coil assembly and a secondary coil assembly included in the transformer 500 of FIG. 17.

Referring to FIGS. 17 through 20, the transformer 500 includes a primary coil assembly and a secondary coil assembly somewhat similar to the transformer 100 of FIG. 1. The primary coil assembly includes a plurality of primary coils 510 and 550 respectively formed in a plurality of metal layers ML1 and ML2, and a first interlayer connection unit 520 for connecting the primary coils 510 and 550. The secondary coil assembly includes a plurality of secondary coils 530 and 570 respectively formed in the plurality of metal layers ML1 and ML2, and a second interlayer connection unit 540 for connecting the secondary coils 530 and 570. Compared to the primary coils 410 and 450 and the secondary coils 430 and 470, that have one turn as illustrated in FIGS. 13 through 16, each of the primary coils 510 and 550 and the secondary coils 530 and 570 have two turns as illustrated in FIGS. 17 through 20. However, the structure of the primary and secondary coils is not limited thereto and each coil may have three or more turns.

The primary and secondary coils formed in the same metal layer are concentric and axisymmetric with respect to a diameter line passing through a planar center point. For example, the first primary coil 510 and the first secondary coil 530 formed in the first metal layer ML1 are axisymmetric with respect to a diameter line LH1 passing through a planar center point C1 (referring to LH1 and C1 in FIG. 11, for example), and the second primary coil 550 and the second secondary coil 570 formed in the second metal layer ML2 are axisymmetric with respect to a diameter line LH2 passing through a planar center point C2 (referring to LH2 and C2 in FIG. 12, for example). Also shown is center point C.

As compared to the transformer 100 of FIG. 1, wherein the first primary coil 110 (including first and second segments 110a and 110b) overlies the second primary coil 150 (including fifth and sixth segments 150a and 150b) and the first secondary coil 130 (including third and fourth segments 130a and 130b) overlies the second secondary coil 170 (including seventh and eighth segments 170a and 170b), in the transformer 500 of FIG. 17, the first primary coil 510 (including first, second, third, and fourth segments 510a, 510b, 510c, and 510d) overlies the second secondary coil 570 (including thirteenth, fourteenth, fifteenth, and sixteenth segments 570a, 570b, 570c, and 570d) and the first secondary coil 530 (including fifth, sixth, seventh, and eighth segments 530a, 530b, 530c, and 530d) overlies the second primary coil 550 (including ninth, tenth, eleventh, and twelfth segments 550a, 550b, 550c, and 550d).

As illustrated in FIGS. 17, 19 and 20, the primary coil assembly may further include a first primary terminal 512 formed in the first metal layer ML1 and a second primary terminal 552 formed in the second metal layer ML2, such that the first primary terminal 512 is connected to an outer end of the first primary coil 510 and the second primary terminal 552 is connected to an outer end of the second primary coil 550. Similarly, the secondary coil assembly may further include a first secondary terminal 532 formed in the first metal layer ML1 and a second secondary terminal 572 formed in the second metal layer ML2, such that the first secondary terminal 532 is connected to an outer end of the first secondary coil 530 and the second secondary terminal 572 is connected to an outer end of the second secondary coil 570. The first and second primary terminals 512 and 552 and the first and second secondary terminals 532 and 572 are also axisymmetric with respect to the vertical axis LV so that the fully symmetric structure of the transformer 500 may be maintained.

A current path through the primary coil assembly, from the first primary terminal 512 to the second primary terminal 552, is centripetal in the first primary coil 510 and centrifugal in the second primary coil 550, and a current path through the secondary coil assembly, from the second secondary terminal 572 to the first secondary terminal 532, is centripetal in the second secondary coil 570 and centrifugal in the first secondary coil 530. In other words, with respect to the primary coil assembly, the first primary coil 510, formed in the first metal layer ML1, is centripetal from the outer end of the first primary coil 510 that is connected to the first primary terminal 512, an inner end of the first primary coil 510 that is connected to the second metal layer ML2 through the first interlayer connection unit 520, and the second primary coil 550, formed in the second metal layer ML2, is centrifugal from an inner end to the outer end that is connected to the second primary terminal 552. Similar may be said about the secondary coil assembly. As such, the secondary coil assembly is fully symmetric with the primary coil assembly.

Figure 21:
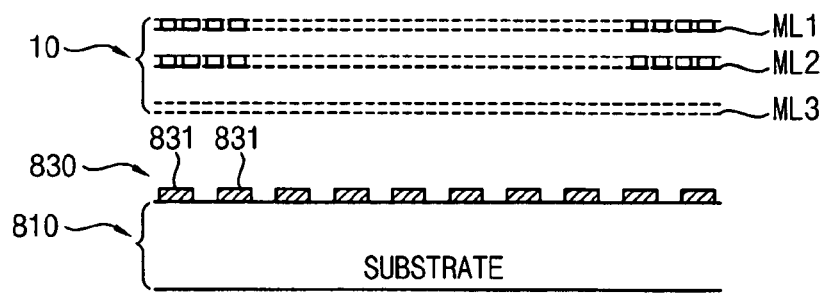
FIG. 21 illustrates an integrated circuit according to an example embodiment.

FIG. 21 illustrates an integrated circuit according to an example embodiment.

Referring to FIG. 21, an integrated circuit 800 includes a semiconductor substrate 810 and a transformer 10. Elements such as transistors (not shown) are formed on the semiconductor substrate 810. The elements in the semiconductor substrate 810 may be formed using a metal-oxide semiconductor (MOS) manufacturing process. However, manufacturing techniques and/or processes are not limited thereto and various other suitable techniques and/or process may be used, as will be obvious to one of ordinary skills in the art. The transformer 10 is formed over the semiconductor substrate 810 and at least one terminal of the transformer 10 is coupled to at least one of the elements of the semiconductor substrate 810. The transformer 10 may be, for example, the fully symmetric transformers 100, 300, 400, 500 described according to example embodiments illustrated in FIGS. 1 through 20. The transformer 10 may be constructed within metal layers during a back end-of-line (BEOL) portion of the MOS manufacturing process or other similar processes. The transformer 10 may be formed in a relatively smaller area and may have relatively higher coupling ratio and inductance.

In other example embodiments, the integrated circuit 800 may further include a shield pattern layer 830 formed between the transformer 10 and the semiconductor substrate 810. A number of patterns 831 may be formed in the shield pattern layer 830 at regular intervals for reducing losses from the transformer 10 into the semiconductor substrate 810.

As described above, a center tap may be connected at a point midway long the length of the primary coil assembly or the secondary coil assembly of the transformer 10, and thus the transformer 10 may be used as a balun, that may convert electrical signals that are balanced about ground (differential) to signals that are unbalanced (single-ended) and vice versa. For example, information may be transmitted in a differential signal form in a radio frequency (RF) chip for improving noise immunity and performance characteristics of the RF chip, whereas information may be transmitted in a single-ended signal form on a printed circuit board (PCB) on which the RF chip is mounted. Thus, an element such as a balun may be required for converting between the differential signal and the single-ended signal in a RF communication device.

The transformers, according to example embodiments, may also have application as passive elements in an RF circuit, although their application is not limited thereto. For example, the transformer may be used as a resonance element and may substitute for an inductor in circuits such as a voltage-controlled oscillator (VCO), a low noise amplifier (LNA), and the like. In this case, improvement in inductance, Q-factor, an occupation area may be obtained due to the coupling between the primary and secondary coils, as compared to a case where two distinct inductors are used. The fully symmetric transformers, according to example embodiments, may also be used for direct current (DC) isolation and impedance matching purposes. The primary and secondary coil assemblies are an open circuit with respect to a DC signal, and thus DC signals may be attenuated by the transformer. The transformer may be used in an RF circuit for regulating current/voltage/impedance according to a ratio of numbers of turns between the primary and secondary coils.

Figure 22:
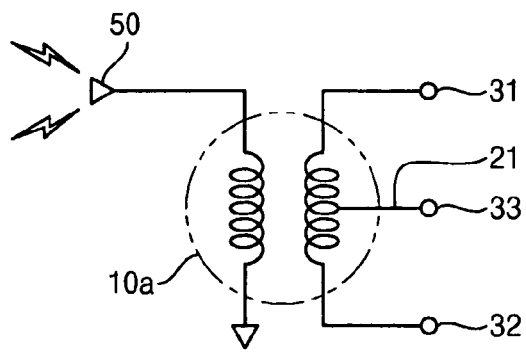
FIGS. 22 and 23 illustrate circuits for transmitting and receiving a radio frequency (RF) signal.
Figure 23:
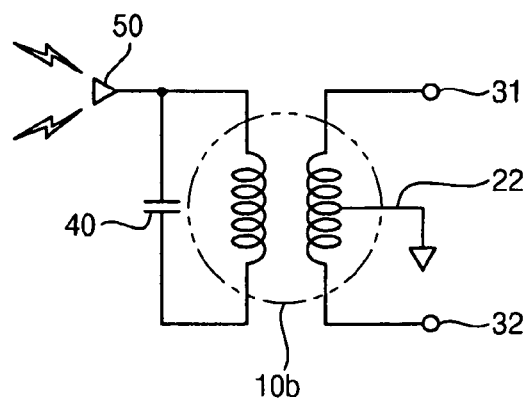

FIGS. 22 and 23 are example circuit diagrams illustrating configuration for transmitting and/or receiving a radio frequency signal.

As illustrated in FIGS. 22 and 23, the transformers 10a and 10b formed over the semiconductor substrate may be used as baluns with the center taps 21 and 22. The primary coil assembly or the secondary coil assembly may be connected to an antenna 50 for receiving and/or transmitting a radio frequency (RF) signal. In FIG. 22, one terminal of the primary coil assembly is connected to the antenna 50, the other terminal of the primary coil assembly is connected to ground, and the center tap 21, drawn out from the secondary coil assembly, is connected to a reference voltage terminal 33. In FIG. 23, both terminals of the primary coil assembly are connected to the antenna 50 through a capacitor 40, and the center tap 22, drawn out from the secondary coil assembly, is connected to ground. The terminals 31 and 32 may be connected to electrical elements, for example, transistors formed in the semiconductor substrate.

As described with reference to above example embodiments, the transformers may occupy a relatively small area and coils in the transformers may have relatively high inductance due to the spiral coil structure. The transformers may have relatively high magnetic coupling ratio due to the fully symmetric structure of the primary and secondary coil assemblies. The magnetic coupling ratio of the transformer may be increased by increasing the number of turns of each coil or by decreasing an interval between the coils. The transformers, according to example embodiments, have a spiral structure including multi-turn helical coils, and thus the number of turns may be efficiently increased in a relatively small area. Also the transformers, according to example embodiments, have a stack structure in which the primary and secondary coils may be coupled vertically, and thus the interval between the coils may be reduced with relative ease in a vertical coupling structure as compared to a horizontal coupling structure. The degree of symmetry in the transformer is of relative importance, since an efficiency with which power may be transferred from input to output may be improved when inductances of the primary and secondary coils are equivalent. The transformers, according to example embodiments, have a fully symmetric structure so that the lengths of the primary and secondary coil assemblies may substantially be the same.

As mentioned above, the transformers and/or baluns, according to example embodiments, may be efficiently used in electrical circuits, for example, in RF circuits, due to the small area occupied, high magnetic coupling ratio and improved noise characteristic due to the symmetric structure.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A transformer, comprising:
   a primary coil assembly, including a plurality of primary coils formed in a plurality of metal layers, a first interlayer connection unit for connecting the primary coils, and first and second primary terminals for supplying energy to or receiving energy from the plurality of primary coils, at least one primary coil of the plurality of primary coils having at least one substantially continuous turn in at least one metal layer of the plurality of metal layers; and
   a secondary coil assembly, including a plurality of secondary coils formed in the plurality of metal layers, a second interlayer connection unit for connecting the secondary coils, and first and second secondary terminals for supplying energy to or receiving energy from the plurality of secondary coils, at least one secondary coil of the plurality of secondary coils having at least one substantially continuous turn in the at least one metal layer;

wherein the primary and secondary coils formed in a same metal layer of the plurality of metal layers are concentric and axisymmetric with respect to a diameter line passing through a planar center point, wherein the first primary terminal is in a different metal layer than the second primary terminal, and wherein the first secondary terminal is in a different metal layer than the second secondary terminal.

2. The transformer of claim 1, wherein the primary coil assembly and the secondary coil assembly are axisymmetric with respect to a vertical axis that is perpendicular to the metal layers and passes through the planar center point.

3. The transformer of claim 1, wherein each of the primary and secondary coils includes a plurality of segments, and wherein an average radius of each of the primary and secondary coils decreases per half turn.

4. The transformer of claim 1, wherein with respect to each primary coil and each secondary coil formed in the same metal layer, wherein each primary coil includes a first segment corresponding to a half turn with a first average radius and a second segment corresponding to another half turn with a second average radius that is shorter than the first average radius, and wherein each secondary coil includes a third segment corresponding to a half turn with the second average radius and a fourth segment corresponding to another half turn with the first average radius such that the third segment is formed inside the first segment and the fourth segment is formed outside the second segment.

5. The transformer of claim 1, wherein the primary coils include a first primary coil formed in a first metal layer and a second primary coil formed in a second metal layer under the first metal layer, wherein the secondary coils include a first secondary coil formed in the first metal layer and a second primary coil formed in the second metal layer, and wherein the first primary coil overlies the second primary coil and the first secondary coil overlies the second secondary coil.

6. The transformer of claim 5, wherein the primary coil assembly further includes a primary crossing unit for crossing the second secondary coil, and wherein the secondary coil assembly further includes a secondary crossing unit for crossing the second primary coil.

7. The transformer of claim 6, wherein the primary crossing unit includes a first bridge formed in a third metal layer, the third metal layer underlying the second metal layer, and third and fourth interlayer connection units for connecting both ends of the first bridge to the second primary coil formed in the second metal layer, and wherein the secondary crossing unit includes a second bridge formed in the third metal layer, the third metal layer underlying the second metal layer, and fifth and sixth interlayer connection units for connecting both ends of the second bridge to the second secondary coil formed in the second metal layer.

8. The transformer of claim 6, wherein the primary crossing unit is formed under the second interlayer connection unit of the secondary coil assembly, and wherein the secondary crossing unit is formed under the first interlayer connection unit of the primary coil assembly.

9. The transformer of claim 6, wherein the primary crossing unit is formed under the first interlayer connection unit of the primary coil assembly, and wherein the secondary crossing unit is formed under the second interlayer connection unit of the secondary coil assembly.

10. The transformer of claim 6, wherein the first primary terminal is formed in the first metal layer and the second primary terminal is formed in a third metal layer, the third metal layer underlying the second metal layer, wherein the first primary terminal is connected to an outer end of the first primary coil, wherein the second primary terminal is connected to an inner end of the second primary coil, wherein the first secondary terminal is formed in the first metal layer and the second secondary terminal is formed in the third metal layer, wherein the first secondary terminal is connected to an outer end of the first secondary coil, and wherein the second secondary terminal is connected to an inner end of the second secondary coil.

11. The transformer of claim 10, wherein a current path through the primary coil assembly, from the first primary terminal to the second primary terminal, is centripetal in both of the first and second primary coils, and wherein a current path through the secondary coil assembly, from the second secondary terminal to the first secondary terminal, is centrifugal in both of the first and second secondary coils.

12. The transformer of claim 1, wherein the plurality of primary coils include a first primary coil formed in a first metal layer and a second primary coil formed in a second metal layer, the second metal layer underlying the first metal layer, wherein the plurality of secondary coils include a first secondary coil formed in the first metal layer and a second primary coil formed in the second metal layer, and wherein the first primary coil overlies the second secondary coil and the first secondary coil overlies the second primary coil.

13. The transformer of claim 12, wherein the first primary terminal is formed in the first metal layer and the second primary terminal is formed in the second metal layer, wherein the first primary terminal is connected to an outer end of the first primary coil, wherein the second primary terminal is connected to an outer end of the second primary coil, wherein the first secondary terminal is formed in the first metal layer and the second secondary terminal is formed in the second metal layer, wherein the first secondary terminal is connected to an outer end of the first secondary coil, and wherein the second secondary terminal is connected to an outer end of the second secondary coil.

14. The transformer of claim 13, wherein a current path through the primary coil assembly from the first primary terminal to the second primary terminal is centripetal in the first primary coil and centrifugal in the second primary coil, and wherein a current path through the secondary coil assembly from the second secondary terminal to the first secondary terminal is centripetal in the second secondary coil and centrifugal in the first secondary coil.

15. The transformer of claim 1, wherein the transformer is octagonal in shape when viewed from the top, and
wherein the primary and secondary coils formed in the same metal layer are axisymmetric with respect to the diameter line passing through center points of two opposite sides of the octagonal structure.

16. A balanced-unbalanced transformer (balun), comprising:
a primary coil assembly, including a plurality of primary coils formed in a plurality of metal layers, a first interlayer connection unit for connecting the primary coils, and first and second primary terminals for supplying energy to or receiving energy from the plurality of primary coils, at least one primary coil of the plurality of primary coils having at least one substantially continuous turn in at least one metal layer of the plurality of metal layers; and
a secondary coil assembly, including a plurality of secondary coils formed in the plurality of metal layers, a second interlayer connection unit for connecting the secondary coils, and first and second secondary terminals for supplying energy to or receiving energy from the plurality of secondary coils, at least one secondary coil of the plurality of secondary coils having at least one substantially continuous turn in the at least one metal layer; and
a center tap connected to the primary coil assembly or the secondary coil assembly at a point midway along a length of the primary coil assembly or the secondary coil assembly;
wherein the primary and secondary coils formed in a same metal layer of the plurality of metal layers are concentric and axisymmetric with respect to a diameter line passing through a planar center point,
wherein the first primary terminal is in a different metal layer than the second primary terminal, and
wherein the first secondary terminal is in a different metal layer than the second secondary terminal.

17. An integrated circuit, comprising:
a semiconductor substrate including a plurality of electrical elements; and
a transformer formed over the semiconductor substrate;
wherein the transformer includes:
a primary coil assembly, including a plurality of primary coils formed in a plurality of metal layers, a first interlayer connection unit for connecting the primary coils, and first and second primary terminals for supplying energy to or receiving energy from the plurality of primary coils, at least one primary coil of the plurality of primary coils having at least one substantially continuous turn in at least one metal layer of the plurality of metal layers; and
a secondary coil assembly, including a plurality of secondary coils formed in the plurality of metal layers, a second interlayer connection unit for connecting the secondary coils, and first and second secondary terminals for supplying energy to or receiving energy from the plurality of secondary coils, at least one secondary coil of the plurality of secondary coils having at least one substantially continuous turn in the at least one metal layer;
wherein the primary and secondary coils formed in a same metal layer of the plurality of metal layers are concentric and axisymmetric with respect to a diameter line passing through a planar center point,
wherein the first primary terminal is in a different metal layer than the second primary terminal,
wherein the first secondary terminal is in a different metal layer than the second secondary terminal, and
wherein at least one of the first primary terminal, the second primary terminal, the first secondary terminal, and the second secondary terminal is coupled to at least one of the plurality of electrical elements formed in the semiconductor substrate.

18. The integrated circuit of claim 17, wherein the primary coil assembly and the secondary coil assembly are axisymmetric with respect to a vertical axis that is perpendicular to the plurality of metal layers and passes through the planar center point.

19. The integrated circuit of claim 17, further comprising:
a shield pattern layer between the transformer and the semiconductor substrate;
wherein a plurality of patterns are formed on the shield pattern layer.

20. The integrated circuit of claim 17, further comprising:
a center tap connected to the primary coil assembly or the secondary coil assembly at a point midway along the length of the primary coil assembly or the secondary coil assembly;
wherein the primary coil assembly or the secondary coil assembly is connected to an antenna for receiving and transmitting a radio frequency signal.

* * * * *